(12) United States Patent
Jean et al.

(10) Patent No.: US 12,507,597 B2
(45) Date of Patent: Dec. 23, 2025

(54) PIEZOELECTRIC CERAMIC TRANSDUCER

(71) Applicant: CERMAX CO., LTD., New Taipei (TW)

(72) Inventors: Nai-Ying Jean, New Taipei (TW); Kuo-Chieh Huang, New Taipei (TW)

(73) Assignee: CERMAX CO., LTD., New Taipei (TW)

( * ) Notice: Subject to any disclaimer, the term of this patent is extended or adjusted under 35 U.S.C. 154(b) by 850 days.

(21) Appl. No.: 17/850,820

(22) Filed: Jun. 27, 2022

(65) Prior Publication Data

US 2023/0217831 A1 Jul. 6, 2023

(30) Foreign Application Priority Data

Dec. 30, 2021 (TW) .................. 110149582

(51) Int. Cl.
*H10N 30/853* (2023.01)
*H10N 30/87* (2023.01)

(52) U.S. Cl.
CPC ......... *H10N 30/853* (2023.02); *H10N 30/872* (2023.02)

(58) Field of Classification Search
CPC ... H10N 30/872; H10N 30/853; B06B 1/0655
See application file for complete search history.

(56) References Cited

U.S. PATENT DOCUMENTS

| 4,557,146 A * | 12/1985 | Buffington | G10K 11/32 73/642 |
| 2007/0034016 A1 * | 2/2007 | Maginnis | G01F 1/662 73/861.28 |
| 2020/0061677 A1 * | 2/2020 | Nakano | B08B 3/12 |
| 2022/0265302 A1 * | 8/2022 | Thirumalai | A61B 17/320068 |

FOREIGN PATENT DOCUMENTS

| JP | 2837723 B2 * | 12/1998 | |
| KR | 20080040111 A * | 5/2008 | A61B 17/225 |

\* cited by examiner

*Primary Examiner* — J. San Martin
(74) *Attorney, Agent, or Firm* — HSML P.C.

(57) ABSTRACT

A piezoelectric ceramic transducer includes a tubular body and a metal electrode unit. The tubular body is made of a piezoelectric ceramic material, and includes an inner surrounding surface surrounding an extending central axis thereof and defining an axial through hole, an outer surrounding surface surrounding the inner surrounding surface, and a connecting surface connected between the inner surrounding surface and the outer surrounding surface. Any tangent plane of the connecting surface of the tubular body is not perpendicular to the extending central axis. The metal electrode unit includes a first layer formed on the inner surrounding surface, and a second layer formed on the outer surrounding surface.

12 Claims, 8 Drawing Sheets

PIEZOELECTRIC CERAMIC TRANSDUCER

CROSS-REFERENCE TO RELATED APPLICATION

This application claims priority to Taiwanese Invention Patent Application No. 110149582, filed on Dec. 30, 2021.

FIELD

The disclosure relates to a transducer, and more particularly to a piezoelectric ceramic transducer.

BACKGROUND

A conventional piezoelectric ceramic transducer is used for emitting an ultrasonic signal to a target, and has a tubular main body that surrounds a central axis and that has two opposite end surfaces along the central axis. The end surfaces of the tubular main body are perpendicular to the central axis. Because of the configuration of the end surfaces (i.e., the end surfaces being perpendicular to the central axis), if the outer surface of the target is uneven, concave, convex or perforated, the ultrasonic signal emitted by the conventional piezoelectric ceramic transducer may suffer from energy attenuation due to scattering or absorption of energy. In order to enlarge the deformation of the conventional piezoelectric ceramic transducer, the wall thickness of the tubular main body is often designed to be extremely small, and thus the surface area of each of the end surfaces of the tubular main body is relatively small. As such, the conventional piezoelectric ceramic transducer may be only able to vibrate in the radial direction, and to emit a single-frequency ultrasonic wave in one direction. The abovementioned configuration of the tubular main body may reduce the signal transmission between the target and the conventional piezoelectric ceramic transducer.

SUMMARY

Therefore, an object of the disclosure is to provide a piezoelectric ceramic transducer that can alleviate at least one of the drawbacks of the prior art.

According to the disclosure, the piezoelectric ceramic transducer includes a tubular body and a metal electrode unit. The tubular body is made of a piezoelectric ceramic material, and includes an inner surrounding surface that surrounds an extending central axis of the tubular body and that defines an axial through hole, an outer surrounding surface that surrounds the inner surrounding surface, and a connecting surface that is connected between the inner surrounding surface and the outer surrounding surface. Any tangent plane of the connecting surface of the tubular body is configured not to be perpendicular to the extending central axis. The metal electrode unit includes a first layer that is formed on the inner surrounding surface of the tubular body, and a second layer that is formed on the outer surrounding surface of the tubular body.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
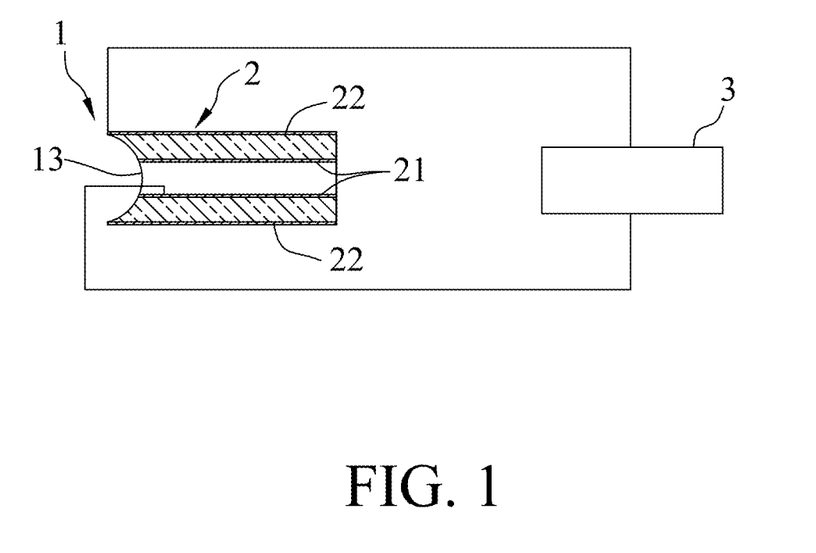
FIG. 1 is a schematic view illustrating an embodiment of the piezoelectric ceramic transducer according to the disclosure.
Figure 2:
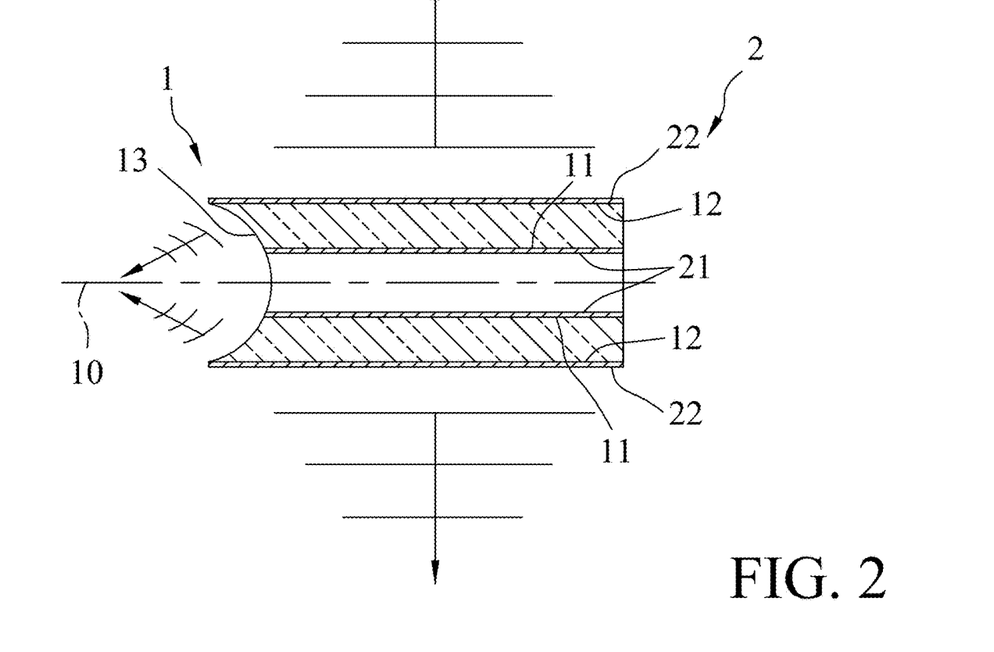
FIG. 2 is a sectional view illustrating a first example of a tubular body of the embodiment.

Referring to FIGS. 1 and 2, the embodiment of the piezoelectric ceramic transducer according to the disclosure includes a tubular body 1, a metal electrode unit 2 and a driving circuit 3.

The tubular body 1 is made of a piezoelectric ceramic material, and includes an inner surrounding surface 11 that surrounds an extending central axis 10 thereof and that defines an axial through hole, an outer surrounding surface 12 that surrounds the inner surrounding surface 11, and a connecting surface that is connected between the inner surrounding surface 11 and the outer surrounding surface 12. Any tangent plane of the connecting surface of the tubular body 1 is configured not to be perpendicular to the extending central axis 10. The metal electrode unit 2 includes a first layer 21 that is formed on the inner surrounding surface 11 of the tubular body 1, and a second layer 22 that is formed on the outer surrounding surface 12 of the tubular body 1.

The driving circuit 3 includes a first end that is connected to the first layer 21 of the metal electrode unit 2, and a second end that is connected to the second layer 22 of the metal electrode unit 2. The driving circuit 3 emits a first driving signal with a single frequency or a plurality of second driving signals with frequencies varying with time to the first and second layers 21, 22 of the metal electrode unit 2, so that the tubular body 1 performs axial resonance or radial resonance according to the first driving signal to emit an ultrasonic signal, or transmits the CHIRP (Compressed High-Intensity Radiated Pulse) signals at a frequency within the range of the resonant frequency thereof according to the second driving signals to emit a plurality of ultrasonic signals with different resonant frequencies in different directions. The frequency of each of the second driving signals falls within the range of the resonant frequency of the tubular body 1.

FIG. 2 illustrates a first example of the tubular body 1, in which the connecting surface of the tubular body 1 is configured as an annular concave curved surface 13. The annular concave curved surface 13 is symmetric with respect to the extending central axis 10, so that the tubular body 1 has the characteristics of a piezoelectric ceramic tube and the characteristics of high-intensity focused ultrasound (HIFU), and is able to, but is not limited to, focus the energy of the ultrasonic waves. In FIG. 1, each of the arrows denotes the propagation direction of a wave, and the lines transverse to the arrows denote wavefronts.

FIGS. 3 to 7 respectively illustrate the second to sixth example of the tubular body 1. In FIGS. 3 to 7, each of the arrows denotes the propagation direction of a wave, and the lines transverse to the arrows denote wavefronts.

Figure 3:
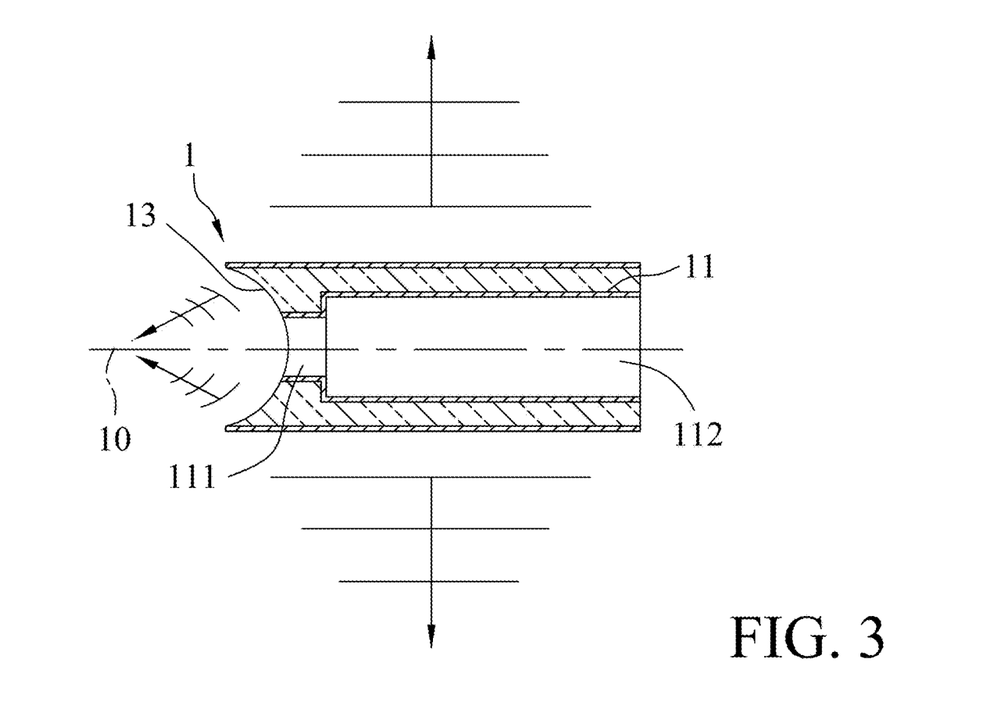
FIG. 3 is a sectional view illustrating a second example of the tubular body.

Referring to FIG. 3, the second example of the tubular body 1 is different from the first example in that: the axial through hole defined by the inner surrounding surface 11 of the tubular body 1 has a small diameter section 111 that is proximate to the annular concave curved surface 13, and a large diameter section 112 that extends from the small diameter section 111.

Figure 4:
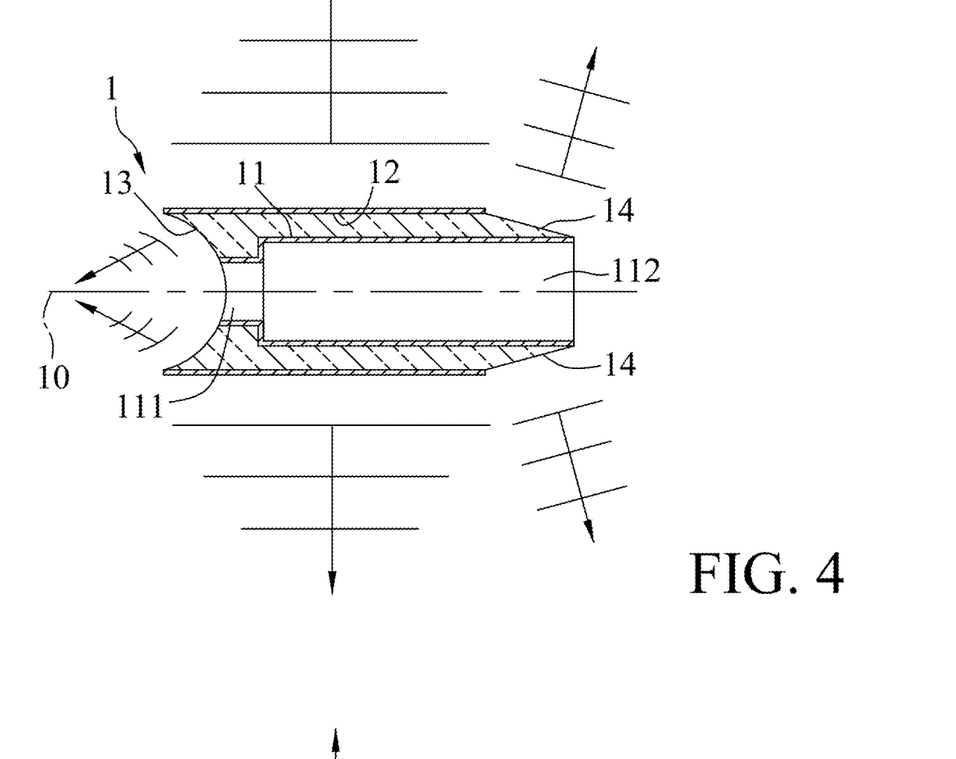
FIG. 4 is a sectional view illustrating a third example of the tubular body.

Referring to FIG. 4, the third example of the tubular body 1 is different from the second example in that: the tubular body 1 further has a frusto-conical surface 14 at an end thereof opposite to the annular concave curved surface 13 that is connected between the inner surrounding surface 11 and the outer surrounding surface 12. The frusto-conical surface 14 is symmetric with respect to the extending central axis 10, and tapers away from the annular concave curved surface 13.

Figure 5:
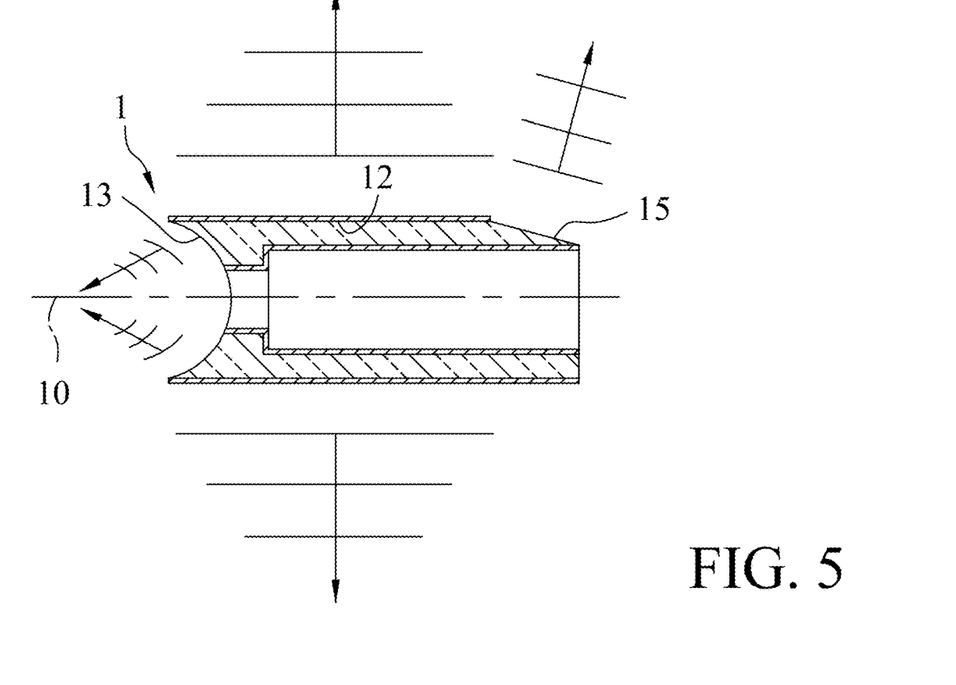
FIG. 5 is a sectional view illustrating a fourth example of the tubular body.

Referring to FIG. 5, the fourth example of the tubular body 1 is different from the second example in that: the tubular body 1 further has a cut surface that is located at an end thereof opposite to the annular concave curved surface 13 and that is planar. In other examples, the tubular body 1 may have a plurality of planar cut surfaces at the end thereof opposite to the annular concave curved surface 13.

Figure 6:
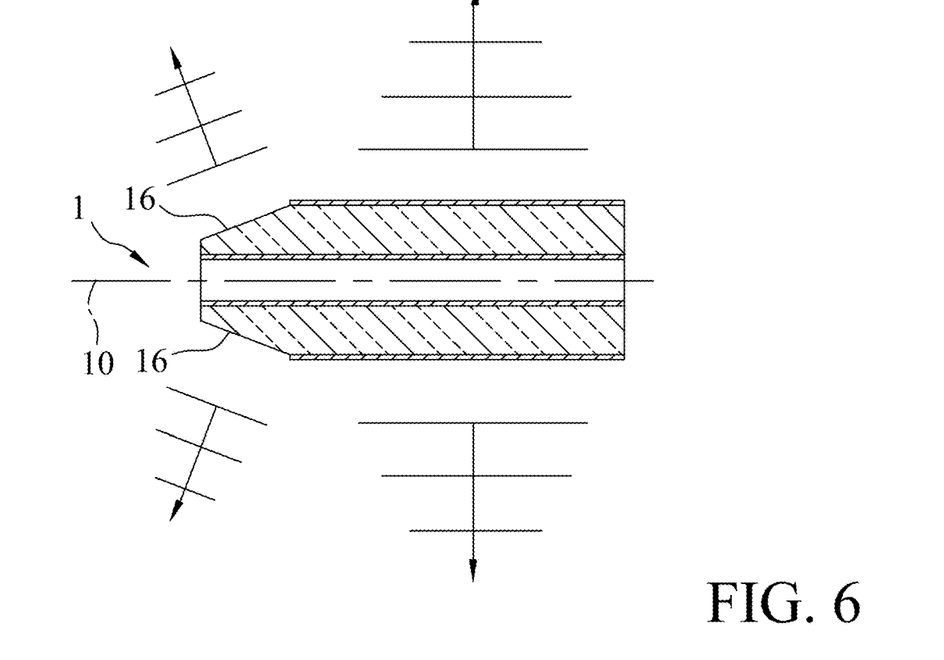
FIG. 6 is a sectional view illustrating a fifth example of the tubular body.

Referring to FIG. 6, the fifth example of the tubular body 1 is different from the first example in that: the connecting surface of the tubular body 1 is configured as a first frusto-conical surface 16.

Figure 7:
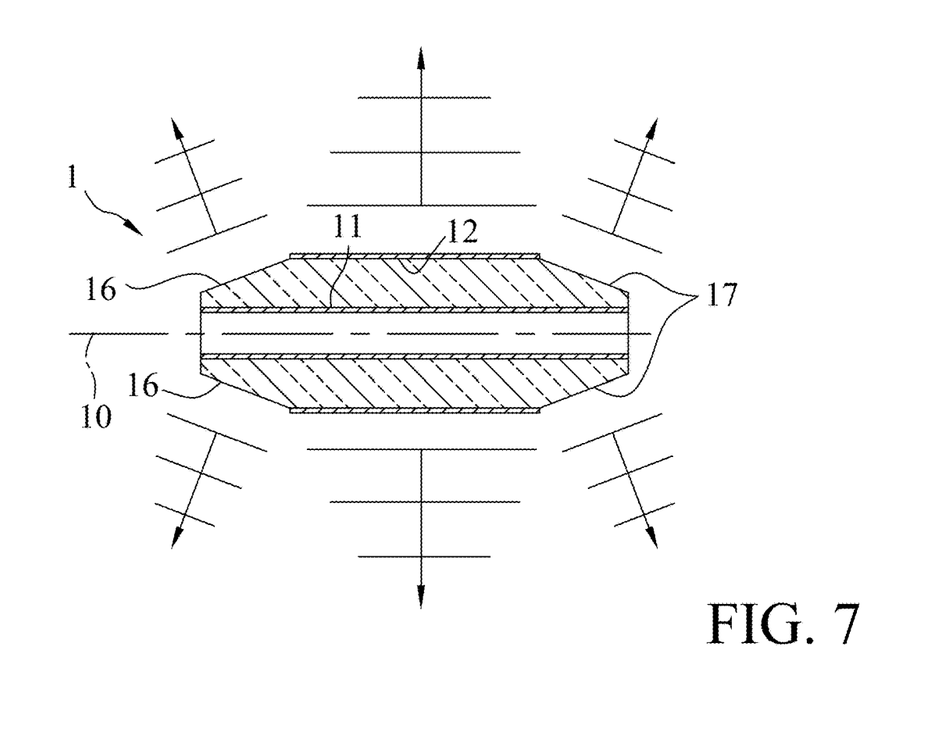
FIG. 7 is a sectional view illustrating a sixth example of the tubular body.

Referring to FIG. 7, the sixth example of the tubular body 1 is different from the fifth example in that: the tubular body 1 further has a second frusto-conical surface 17 that is located at an end thereof opposite to the first frusto-conical surface 16 and that is connected between the inner surrounding surface 11 and the outer surrounding surface 12. The first frusto-conical surface 16 and the second frusto-conical surface 17 are symmetric with respect to the extending central axis 10, and taper away from each other. In other examples, at least one of the first frusto-conical surface 16 and the second frusto-conical surface 17 is not symmetric with respect to the extending central axis 10.

Figure 8:
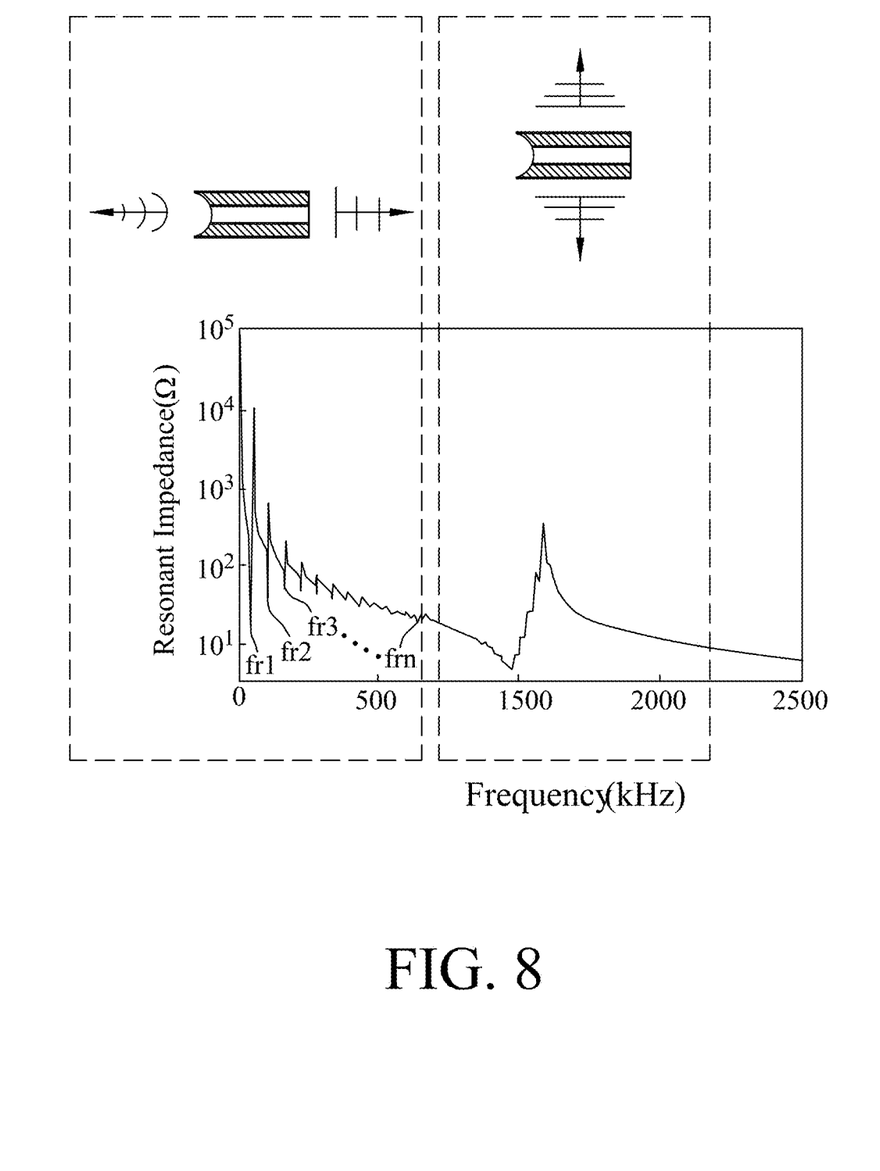
FIG. 8 illustrates a graph of resonant impedance of the embodiment plotted against frequency.

FIG. 8 illustrates a graph of the resonant impedance of the embodiment plotted against frequency. In this embodiment, since any tangent plane of the connecting surface of the tubular body 1 is configured not to be perpendicular to the extending central axis 10, the tubular body 1 has more resonant frequencies fr1, fr2, . . . , frn that cooperatively define the range of resonant frequencies. When the frequency of the driving signal emitted by the driving circuit 3 is relatively low (equal to one of the resonant frequencies), the tubular body 1 performs axial resonance, so that the connecting surface of the tubular body 1 emits the ultrasonic signal. When the frequency of the driving signal emitted by the driving circuit 3 is relatively high, the tubular body 1 performs radial resonance, so that the outer surrounding surface 12 of the tubular body 1 emits the ultrasonic signal. As such, as the driving circuit 3 continuously or intermittently emits driving signals with specific frequencies, the tubular body 1 is able to emit various ultrasonic signals with different resonant frequencies in different directions. In other words, the driving signals with different frequencies and wavelengths enable the tubular body 1 to emit ultrasonic signals with different penetration depths to a target, and to generate scattering effects, so as to enhance the signal transmission between the target and the piezoelectric ceramic transducer by virtue of the ultrasonic signals with different frequencies and in different directions.

Figure 9:
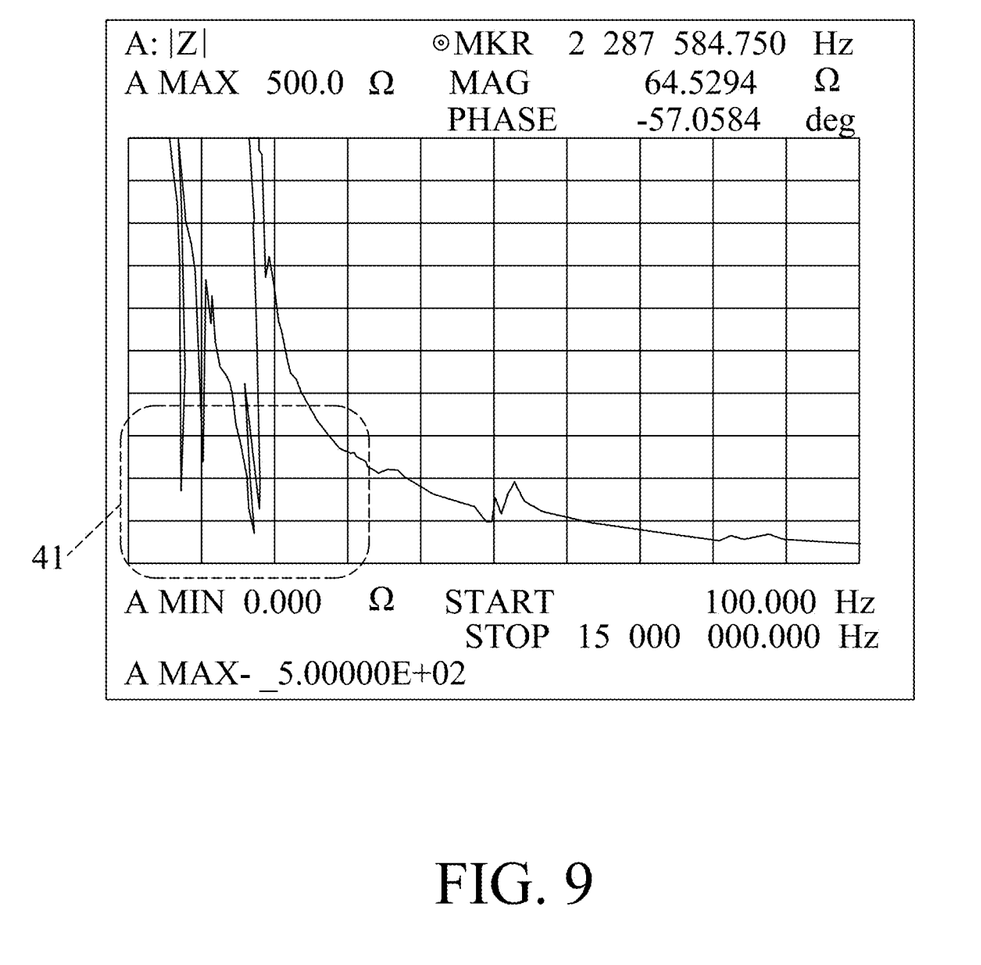
FIG. 9 is a curve chart of resonant points illustrating the characteristics of the resonant impedance of a conventional piezoelectric ceramic transducer.
Figure 10:
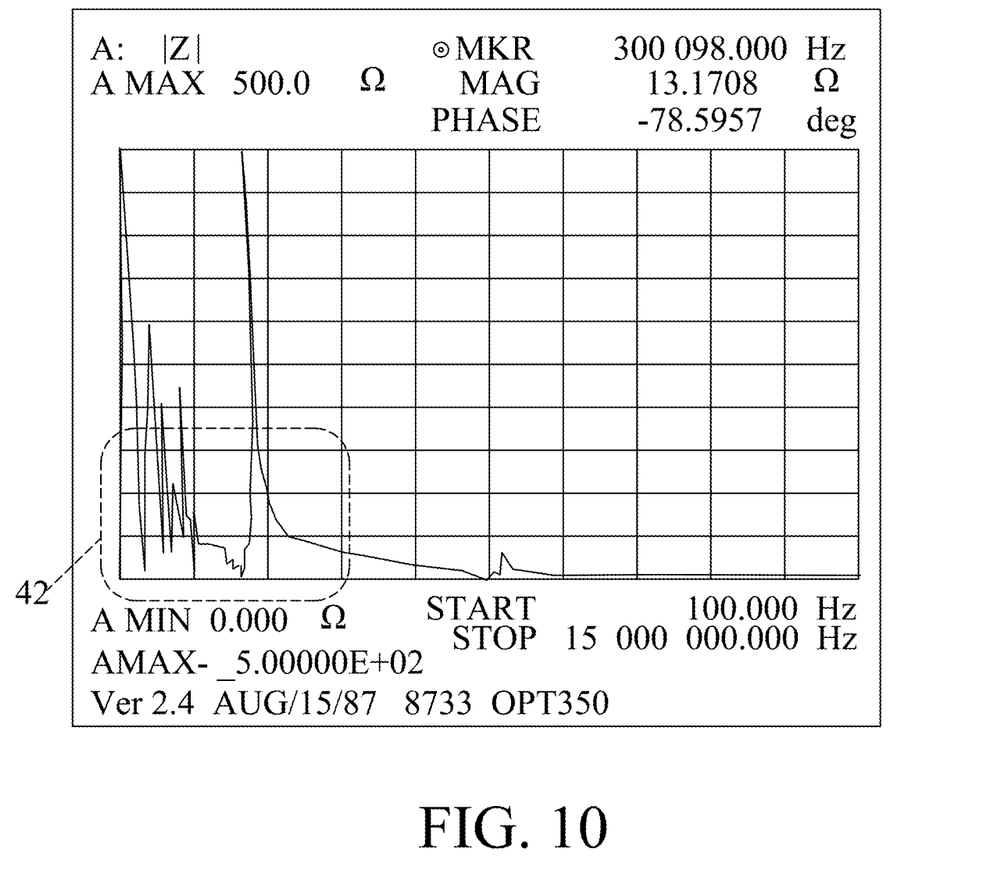
FIG. 10 is a curve chart of resonant points illustrating the characteristics of the resonant impedance of the piezoelectric ceramic transducer according to the disclosure.

FIGS. 9 and 10 are curve charts showing resonant points measured by an impedance analyzer (e.g., HP4194) that respectively illustrate the characteristics of the resonant impedance of the conventional piezoelectric ceramic transducer and the piezoelectric ceramic transducer according to the disclosure with the first example of the tubular body 1. It can be observed from the dashed line squares in FIGS. 9 and 10 that since any tangent plane of the connecting surface of the tubular body 1 is configured not to be perpendicular to the extending central axis 10, the tubular body 1 has more resonant frequencies, and is able to emit ultrasonic signals in different directions.

Figure 11:
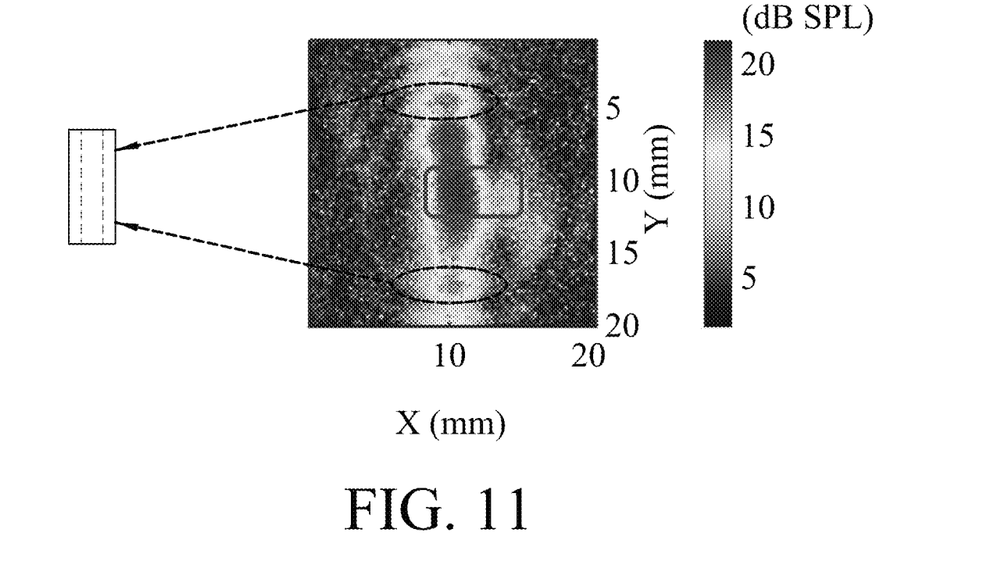
FIG. 11 illustrates the magnitude of the ultrasonic signals emitted by the conventional piezoelectric ceramic transducer.
Figure 12:
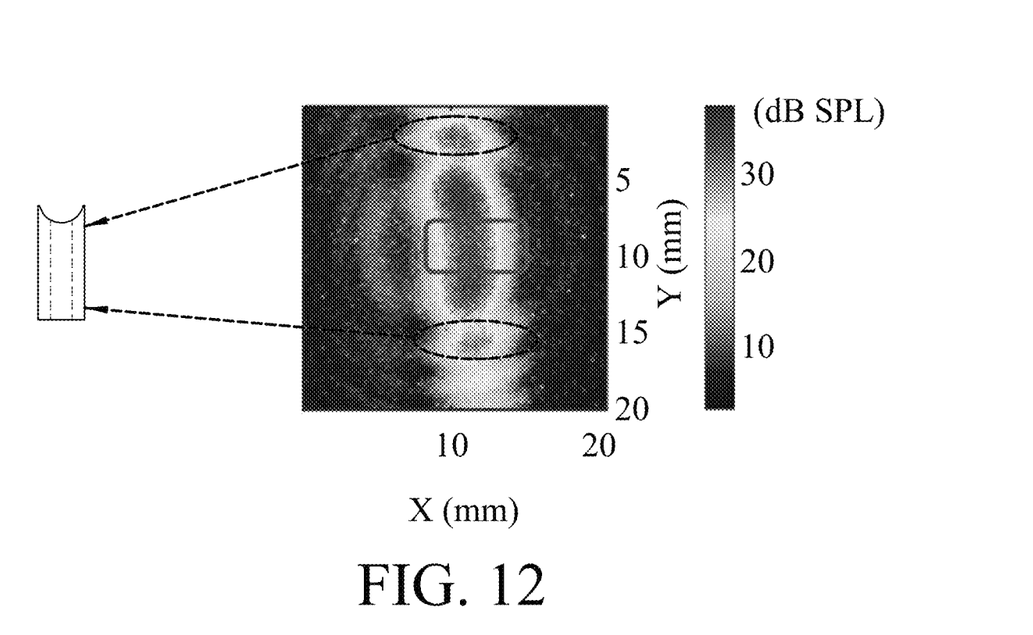
FIG. 12 illustrates the magnitude of the ultrasonic signals emitted by the piezoelectric ceramic transducer according to the disclosure.

FIGS. 11 and 12 respectively illustrate the magnitude of the ultrasonic signals respectively emitted by the conventional piezoelectric ceramic transducer and the piezoelectric ceramic transducer according to the disclosure with the first example of the tubular body 1. X denotes the width of the tubular body 1 and Y denotes the length of the tubular body 1. In FIGS. 11 and 12, both the tubular main body of the conventional piezoelectric ceramic transducer and the tubular body 1 of the piezoelectric ceramic transducer according to the disclosure have an outer diameter of 3.6 millimeters, an inner diameter of 1.6 millimeters and a length of 5 millimeters. It can be observed from FIGS. 11 and 12 that since any tangent plane of the connecting surface of the tubular body 1 is configured not to be perpendicular to the extending central axis 10, the ultrasonic signal emitted by the tubular body 1 has greater sound intensity.

In summary, since any tangent plane of the connecting surface of the tubular body 1 is configured not to be perpendicular to the extending central axis 10, the tubular body 1 has more resonant frequencies, and is able to emit ultrasonic signals with different wavelengths in different directions to a target, so as to alleviate the drawback of the prior art. Specifically, in that the conventional piezoelectric ceramic transducer is only able to emit a single-frequency ultrasonic signal in one direction that is likely to suffer from energy attenuation due to scattering or absorption of energy when the outer surface of the target is uneven, concave, convex or perforated. In addition, in one embodiment, the tubular body 1 may be a one-piece molding component that is more durable.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A piezoelectric ceramic transducer comprising:
a tubular body made of a piezoelectric ceramic material, and including an inner surrounding surface that surrounds an extending central axis of said tubular body and that defines an axial through hole, an outer surrounding surface that surrounds said inner surrounding surface, and a connecting surface that is connected between said inner surrounding surface and said outer surrounding surface, any tangent plane of said connecting surface of said tubular body being configured not to be perpendicular to the extending central axis; and
a metal electrode unit including a first layer that is formed on said inner surrounding surface of said tubular body, and a second layer that is formed on said outer surrounding surface of said tubular body.

2. The piezoelectric ceramic transducer as claimed in claim 1, wherein said connecting surface of said tubular body is configured as an annular concave curved surface.

3. The piezoelectric ceramic transducer as claimed in claim 2, wherein said connecting surface of said tubular body is symmetric with respect to the extending central axis.

4. The piezoelectric ceramic transducer as claimed in claim 2, wherein said tubular body further has a frusto-conical surface that is located at an end of said tubular body opposite to said annular concave curved surface and that is connected between said inner surrounding surface and said outer surrounding surface.

5. The piezoelectric ceramic transducer as claimed in claim 4, wherein said frusto-conical surface is symmetric with respect to the extending central axis, and tapers away from said annular concave curved surface.

6. The piezoelectric ceramic transducer as claimed in claim 2, wherein said tubular body further has a cut surface that is located at that is located at an end of said tubular body opposite to said annular concave curved surface and that is planar.

7. The piezoelectric ceramic transducer as claimed in claim 2, wherein said axial through hole defined by said inner surrounding surface of said tubular body has a small diameter section that is proximate to said annular concave curved surface, and a large diameter section that extends from said small diameter section.

8. The piezoelectric ceramic transducer as claimed in claim 1, wherein said connecting surface of said tubular body is configured as a first frusto-conical surface.

9. The piezoelectric ceramic transducer as claimed in claim 8, wherein said tubular body further has a second frusto-conical surface that is located at an end of said tubular body opposite to said first frusto-conical surface and that is connected between said inner surrounding surface and said outer surrounding surface.

10. The piezoelectric ceramic transducer as claimed in claim 9, wherein said first frusto-conical surface and said second frusto-conical surface are symmetric with respect to the extending central axis, and taper away from each other.

11. The piezoelectric ceramic transducer as claimed in claim 1, further comprising:
a driving circuit including a first end that is connected to said first layer of said metal electrode unit, and a second end that is connected to said second layer of said metal electrode unit, said driving circuit emitting a driving signal with a single frequency to said first and second layers (21, 22) of said metal electrode unit, so that said tubular body performs axial resonance or radial resonance to emit an ultrasonic signal.

12. The piezoelectric ceramic transducer as claimed in claim 1, further comprising:
a driving circuit including a first end that is connected to said first layer of said metal electrode unit, and a second end that is connected to said second layer of said metal electrode unit, said driving circuit emitting a plurality of driving signals with frequencies varying with time to said first and second layers (21, 22) of said metal electrode unit, so that said tubular body emits a plurality of ultrasonic signals with different resonant frequencies in different directions, the frequency of each of the driving signals falling within the range of the resonant frequency of said tubular body.

* * * * *